US012795957B2

United States Patent

(12) United States Patent
Alam et al.

(10) Patent No.: US 12,795,957 B2
(45) Date of Patent: Nov. 10, 2026

(54) HYBRID METHODS AND STRUCTURES FOR INCREASING CAPACITANCE DENSITY IN INTEGRATED PASSIVE DEVICES

(71) Applicants: Advanced Micro Devices, Inc., Santa Clara, CA (US); ATI Technologies ULC, Markham (CA)

(72) Inventors: Arsalan Alam, Austin, TX (US); Anadi Srivastava, Austin, TX (US); Rajen Singh Sidhu, Austin, TX (US); Alexander Helmut Pfeiffenberger, Markham (CA); Liwei Wang, Austin, TX (US)

(73) Assignees: Advanced Micro Devices, Inc., Santa Clara, CA (US); ATI Technologies ULC, Markham (CA)

( * ) Notice: Subject to any disclaimer, the term of this patent is extended or adjusted under 35 U.S.C. 154(b) by 442 days.

(21) Appl. No.: 18/470,582

(22) Filed: Sep. 20, 2023

(65) Prior Publication Data

US 2025/0098184 A1 Mar. 20, 2025

(51) Int. Cl.

| | |
|---|---|
| ***H10D 1/68*** | (2025.01) |
| ***H10D 1/00*** | (2025.01) |
| ***H10W 20/40*** | (2026.01) |
| ***H10W 20/42*** | (2026.01) |
| ***H10W 44/00*** | (2026.01) |

(52) U.S. Cl.

CPC ............. *H10D 1/042* (2025.01); *H10D 1/716* (2025.01); *H10W 20/496* (2026.01); *H10W 44/601* (2026.01); *H10W 20/42* (2026.01)

(58) Field of Classification Search

CPC ... H01L 23/5223; H01L 23/642; H10D 1/042; H10D 1/716; H10W 20/496; H10W 44/601

See application file for complete search history.

(56) References Cited

U.S. PATENT DOCUMENTS

| | | | | |
|---|---|---|---|---|
| 6,980,413 B1 * | 12/2005 | Kim | H01G 4/33 361/308.1 |
| 2025/0096161 A1 * | 3/2025 | Alam | H10D 1/042 |

* cited by examiner

*Primary Examiner* — Molly K Reida

(74) *Attorney, Agent, or Firm* — Greenberg Traurig, LLP

(57) ABSTRACT

A method for increasing capacitance density within an integrated passive device can include forming a first trench capacitor within a substrate, forming a second trench capacitor within an insulating layer overlying the substrate, and connecting the first and second trench capacitors through connection vias that extend through the insulating layer to form an integrated passive device (IPD) capacitor. A high capacitance density device can include a stacked and co-integrated architecture of two or more tiers of trench capacitors.

20 Claims, 4 Drawing Sheets

HYBRID METHODS AND STRUCTURES FOR INCREASING CAPACITANCE DENSITY IN INTEGRATED PASSIVE DEVICES

BACKGROUND

The demand for scalable integrated passive devices, such as capacitors and inductors, has been increasing in response to their use in RF (radio frequency) power amplifiers and in next generation microprocessors for dynamic near-load, on-chip power delivery, for example. While approaches for providing passive components may include the implementation of large decoupling capacitors and thick air-core inductors, such configurations typically have an undesirably large footprint in the context of ongoing miniaturization efforts for these and other applications.

BRIEF DESCRIPTION OF THE DRAWINGS

The accompanying drawings illustrate a number of example implementations and are a part of the specification. Together with the following description, these drawings demonstrate and explain various principles of the present disclosure.

Figure 1:
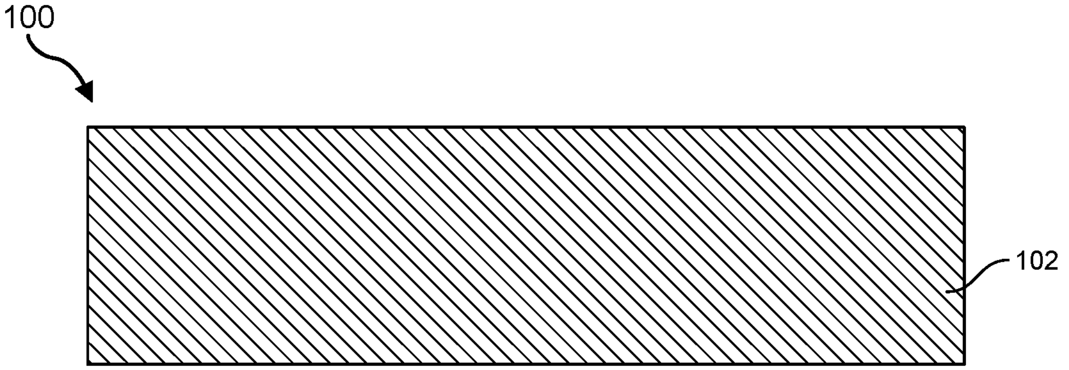
FIG. 1 is a schematic illustration of an example process flow for forming an integrated passive device having increased capacitance density including providing a substrate according to some implementations.

Throughout the drawings, identical reference characters and descriptions indicate similar, but not necessarily identical, elements. While the example implementations described herein are susceptible to various modifications and alternative forms, specific implementations have been shown by way of example in the drawings and will be described in detail herein. However, the example implementations described herein are not intended to be limited to the particular forms disclosed. Rather, the present disclosure covers all modifications, equivalents, and alternatives falling within the scope of the appended claims.

DETAILED DESCRIPTION OF EXAMPLE IMPLEMENTATIONS

Notwithstanding recent developments, it would be advantageous to increase capacitance density in integrated passive devices (IPDs), which can decrease the overall number of IPDs required for a given application and accordingly decrease the overall IPD area used in some systems. Integrated passive devices having a greater capacitance density can provide for improved signal and power integrity and enhance system performance in an economically-attractive package.

According to some implementations, capacitor structures can be formed both in a substrate and in one or more overlying strata and interconnected to increase the total capacitance for a given device area. For instance, plural trench capacitors can be formed within a substrate and also in an overlying insulating layer with the plural layers arranged and interconnected in 3D. Without wishing to be bound by theory, for an array of trench capacitors formed in a substrate having a capacitance density of X mF/mm2, and a single tier of trench capacitors formed in an insulating layer overlying the substrate having a capacitance density of Y mF/mm2, the combined 3D array of trench capacitors can have a capacitance density of approximately X+Y mF/mm2, where the capacitance per layer is effectively summed for a multilayer structure. Moreover, the use of trench capacitors in each tier can increase the surface area of the capacitor's dielectric layer and accordingly increase the capacitance density in each layer relative to planar structures. In accordance with certain implementations, the number (N) of trench capacitor strata overlying the substrate can be 1 or more, e.g., 1, 2, 3, 4, 5, 10, 20, 30, or more.

The term "trench capacitor," as used herein, generally refers to a 3D vertical device formed by etching a trench into a suitable substrate or layer. A capacitor structure can be formed by depositing, in succession, a primary electrode, a dielectric layer, and a secondary electrode within the trench.

Trench architectures can be integrated into a substrate and one or more stacked layers of an insulating material overlying the substrate, and capacitors within different layers can be interconnected using vias that extend through the insulating layer(s). For instance, for first and second trench capacitors located in different layers of a stacked device, e.g., a first trench capacitor formed within a substrate and a second trench capacitor formed within a layer of insulating material overlying the substrate, a primary electrode layer within the first trench capacitor can be electrically connected with a primary electrode layer within the second trench capacitor, a dielectric layer within the first trench capacitor can be connected with a dielectric layer within the second trench capacitor, and a secondary electrode layer within the first trench capacitor can be electrically connected with a secondary electrode layer within the second trench capacitor. In certain configurations, the first and second trench capacitors can be connected in parallel. According to particular implementations, primary electrode layers can be connected to a suitable power supply and secondary electrode layers can be connected to ground.

A method of manufacturing an integrated passive device having a high capacitance density can include forming a first trench capacitor within a substrate, forming a second trench capacitor within an insulating layer overlying the substrate, and connecting the first and second trench capacitors through connection vias that extend through the insulating layer to form an integrated passive device (IPD) capacitor. For such a device, a capacitance density of the integrated passive device (IPD) capacitor can be approximately equal to the sum of the capacitance density of the individual first and second trench capacitors. As will be appreciated, the method can be extended to include the formation and co-integration of any suitable number of trench capacitors. That is, each layer within a stacked structure can include one or more trench capacitors, and the total number of such layers can be two or more.

In connection with further implementations, a method of manufacturing an integrated passive device having a high capacitance density includes forming a first trench within a substrate, forming a first trench capacitor within the first trench, the first trench capacitor including a primary electrode, a dielectric layer overlying the primary electrode, and a secondary electrode overlying the dielectric layer, forming an insulating layer over the first trench capacitor and over the substrate, forming a second trench within the insulating layer, and forming a second trench capacitor within the second trench, the second trench capacitor including a primary electrode, a dielectric layer overlying the primary electrode, and a secondary electrode overlying the dielectric layer.

The method additionally includes forming vias that extend entirely through the insulating layer, forming a conductive layer within primary vias to electrically connect the primary electrode of the first trench capacitor with the primary electrode of the second trench capacitor, forming a conductive layer within secondary vias to electrically connect the secondary electrode of the first trench capacitor with the secondary electrode of the second trench capacitor, and forming a dielectric layer within tertiary vias to connect the dielectric layer of the first trench capacitor with the dielectric layer of the second trench capacitor to form an integrated passive device capacitor.

In one example, a system for increasing capacitance density in integrated passive devices can include a multi-tier arrangement of interconnected trench capacitors. Each tier can include a substrate or an overlying insulating layer defining a trench with a capacitor formed within the trench. Capacitors located in different tiers can be interconnected through vias that extend through one or more of the insulating layers.

Features from any of the implementations described herein can be used in combination with one another in accordance with the general principles described herein. These and other implementations, features, and advantages will be more fully understood upon reading the following detailed description in conjunction with the accompanying drawings and claims.

The present disclosure is generally directed to systems and methods for increasing capacitance density in integrated passive devices. An example process for forming an integrated passive device having increased capacitance density is illustrated schematically in FIGS. 1-9. FIGS. 1-9 each represent a cross sectional view of an IPD structure 100 at various stages of fabrication. A flowchart summarizing an example method of forming a high capacitance density integrated passive device is provided in FIG. 10.

Referring to FIG. 1, structure 100 according to one exemplary implementation includes a bulk substrate 102. The substrate 102 can be made from any of several semiconductor or insulating materials such as, for example, silicon, germanium, a silicon-germanium alloy, a silicon-carbon alloy, a silicon-germanium-carbon alloy, gallium arsenide, indium arsenide, indium phosphide, an organic semiconductor material, a III-V compound semiconductor, a II-VI compound semiconductor, and other compound semiconductors, or an inorganic material such as quartz or fused silica or any of several glass compositions, such as, for example, silicate glass or borosilicate glass. A substrate can include a glass panel. The substrate 102 can be approximately, but is not limited to, several hundred micrometers thick. For example, the substrate 102 can have a thickness ranging from approximately 0.5 mm to approximately 1.5 mm. In some aspects, the substrate 102 can include active devices, such as transistors, which are not shown so as to not obscure features and implementations of the present disclosure.

Figure 2:
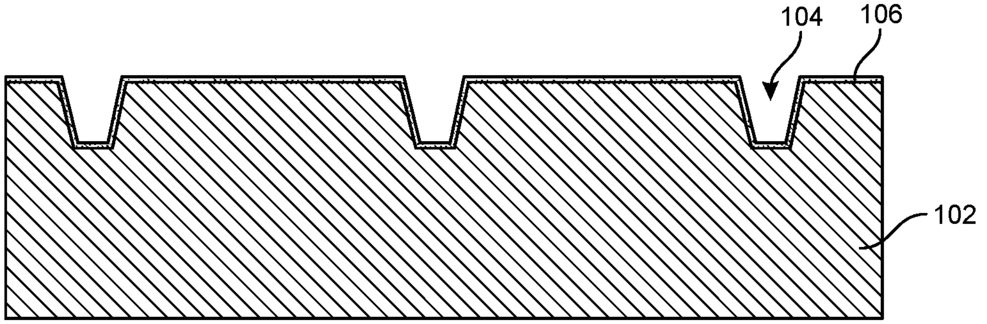
FIG. 2 is a schematic illustration of an example process flow for forming an integrated passive device having increased capacitance density including forming a trench in the substrate of FIG. 1 and forming an insulating layer within the trench according to some implementations.

Referring to FIG. 2, a trench 104 can be formed in substrate 102 using available patterning techniques, such as, for example, photolithography and etching processes. Photolithography can include applying a layer of photoresist (not shown) to an upper surface of the substrate 102, exposing the photoresist to a desired pattern of radiation, and developing the exposed photoresist utilizing a resist developer. The pattern in the photoresist can then be transferred to the substrate 102 using one or more etching techniques to form the trench 104. Suitable etching techniques can include dry etching processes such as reactive ion etching (RIE), ion beam etching, plasma etching, or laser ablation. As will be appreciated, a trench can be formed to a sufficient width and depth to form a capacitor therein. An example trench 104 can have a depth equal to or greater than approximately 1 micrometer. After the trench is formed, the remaining photoresist can be removed.

Referring still to FIG. 2, a layer 106 of insulating material can be formed over the bottom and sidewall surfaces of trench 104. The layer 106 of insulating material can be configured to electrically isolate the substrate 102 from the trench capacitor formed within the trench 104. The insulating layer 106 can include a dielectric oxide or a dielectric nitride. For example, the insulating layer 106 can include silicon dioxide, which can be formed in situ by thermal oxidation of the substrate or deposited by chemical vapor deposition, such as, for example, low pressure chemical vapor deposition (LPCVD), plasma enhanced chemical vapor deposition (PECVD), and high density plasma chemical vapor deposition (HDPCVD). The thickness of the insulating layer 106 can range from approximately 2 nm to approximately 20 nm, e.g., from approximately 4 nm to approximately 10 nm, although lesser and greater thicknesses are contemplated.

Figure 3:
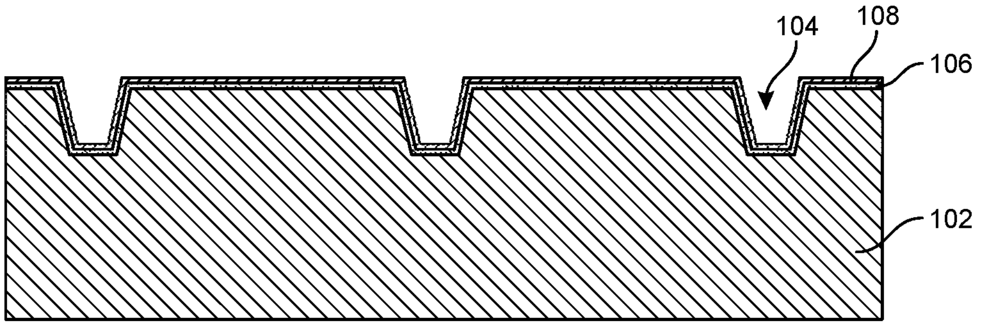
FIG. 3 is a schematic illustration of an example process flow for forming an integrated passive device having increased capacitance density including the formation of a primary electrode within the trench of FIG. 2 according to some implementations.
Figure 4:
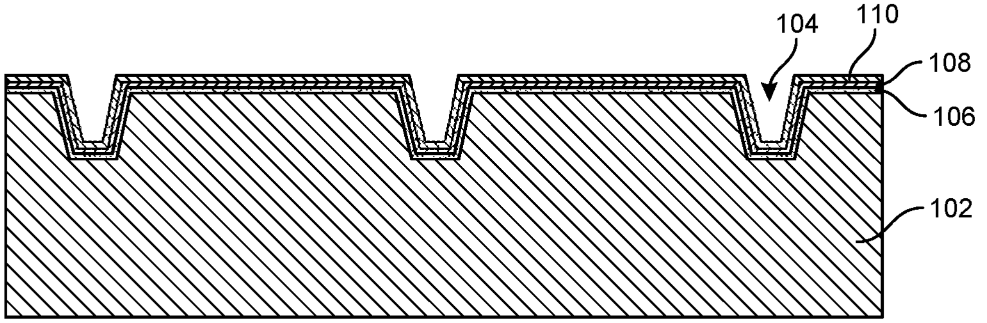
FIG. 4 is a schematic illustration of an example process flow for forming an integrated passive device having increased capacitance density including the formation of a dielectric layer within the trench of FIG. 3 according to some implementations.
Figure 5:
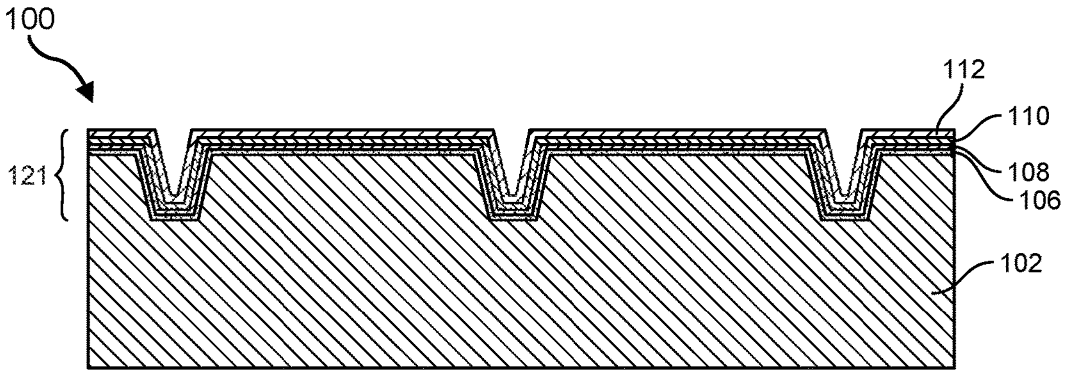
FIG. 5 is a schematic illustration of an example process flow for forming an integrated passive device having increased capacitance density including the formation of a secondary electrode within the trench of FIG. 4 according to some implementations.

A trench capacitor can be formed in each trench 104. A trench capacitor can include a primary electrode 108, a dielectric layer 110, and a secondary electrode 112, which can be deposited conformally and in succession as depicted in FIGS. 3-5. The primary and secondary electrodes can operate as a pair of electrical conductors and the dielectric layer 110 can operate as the insulator between the two conductors.

Referring to FIG. 3, the primary electrode 108 can be formed by depositing a conductive material on the insulating layer 106 disposed over the inner walls and bottom surface of the trench 104. The deposited primary electrode 108 can then be appropriately patterned. The primary electrode 108 can include an elemental metal or a conductive metal alloy. Exemplary elemental metals include Ta, Ti, Co, and W. Exemplary alloys can include a mixture of elemental metals or a conductive metal nitride, such as TiN, ZrN, HfN, VN, NbN, TaN, WN, TiAlN, TaCN, and the like. The primary electrode 108 can be formed using any suitable deposition technique, including, for example, chemical vapor deposition (CVD), such as low pressure chemical vapor deposition (LPCVD), physical vapor deposition (PVD), or atomic layer deposition (ALD). A thickness of the primary electrode 108 can range from approximately 5 nm to approximately 100 nm.

Referring to FIG. 4, dielectric layer 110 can be formed within the trench 104 and directly overlying the primary electrode 108. Following its deposition, the dielectric layer can be appropriately patterned. The dielectric layer 110 can include a dielectric material such as silicon dioxide, silicon nitride, silicon oxynitride, and the like. Alternatively, the dielectric layer 110 can include a high-k material. A high-k material can have a dielectric constant greater than approximately 7.5, i.e., greater than the dielectric constant of silicon nitride. Exemplary high-k materials include $HfO_2$, $ZrO_2$, $La_2O_3$, $Al_2O_3$, $TiO_2$, $SrTiO_3$, $LaALO_3$, $Y_2O_3$, as well as combinations thereof. The thickness of the dielectric layer 110 can range from approximately 2 nm to approximately 100 nm.

Referring to FIG. 5, the secondary electrode 112 can be formed by conformal deposition of a conductive material over the dielectric layer 110. The methods and materials used to form the primary electrode 108 can be used to form the secondary electrode 112. The secondary electrode 112 can be patterned to form a first tier of trench capacitors 121 that include the primary and secondary electrodes and intervening dielectric layer within trenches 104 located within substrate 102.

Figure 6:
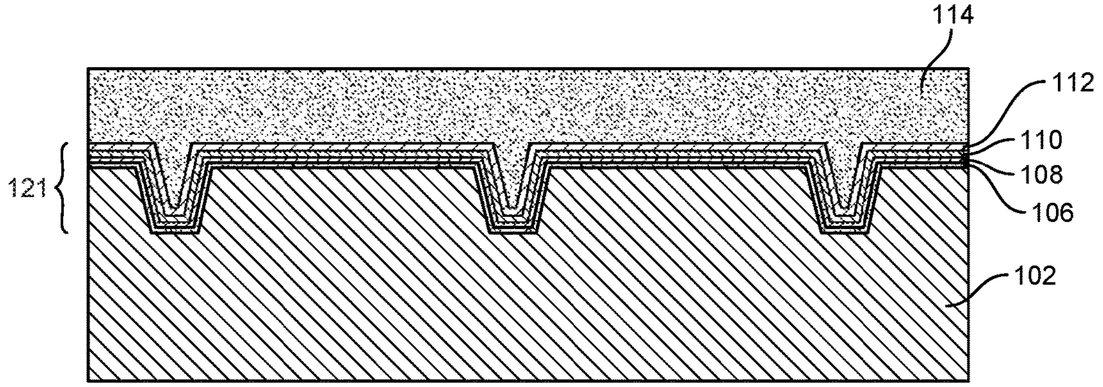
FIG. 6 is a schematic illustration of an example process flow for forming an integrated passive device having increased capacitance density including the formation of an insulating layer over the structure of FIG. 5 according to some implementations.
Figure 7:
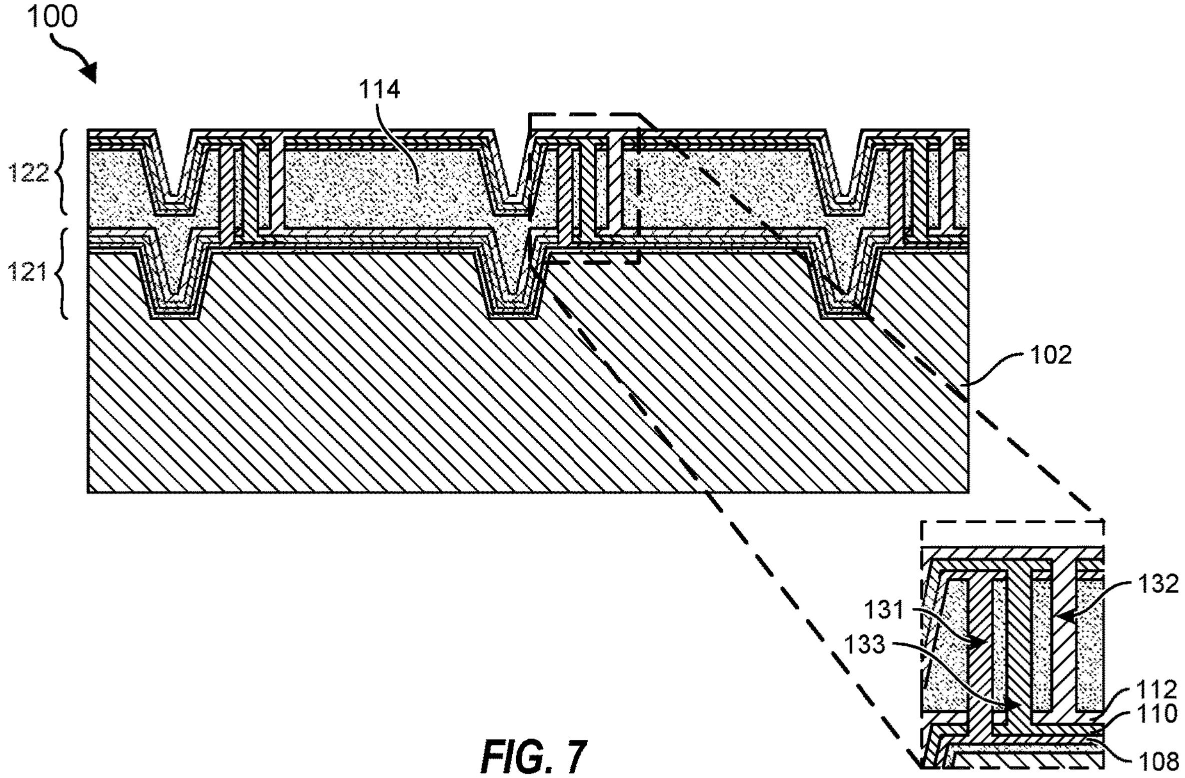
FIG. 7 is a schematic illustration of an example process flow for forming an integrated passive device having increased capacitance density including the formation of a trench capacitor within the insulating layer of FIG. 6 according to some implementations.

Turning to FIG. 6, an insulating layer 114 can be formed over the structure 100 of FIG. 5, i.e., over the first tier of trench capacitors 121. The oxide deposition process disclosed with respect to FIG. 1, including the methods and materials used to form insulating layer 106, can be repeated to form insulating layer 114. The thickness of the insulating layer 114 can range from approximately 500 nm to approximately 2 micrometers, e.g., from approximately 800 nm to approximately 1.5 micrometers, although lesser and greater thicknesses are contemplated. The top surface of insulating layer 114 can be planarized, e.g., using chemical mechanical polishing. Thereafter, as shown in FIG. 7, trenches can be formed in insulating layer 114 and a trench capacitor can be formed in each trench to form a second tier of trench capacitors 122 overlying the first tier of trench capacitors 121. The trenches within insulating layer 114 can be misaligned with the trenches formed in substrate 102 or, as depicted in FIG. 7, the trenches within insulating layer 114 can be aligned with the trenches formed in substrate 102. Forming the second tier of trench capacitors 122 can include successively forming a primary electrode layer, a dielectric layer, and a secondary electrode layer within the one or more trenches located in the insulating layer 114. The second tier of trench capacitors 122 can be compositionally equivalent or compositionally non-equivalent to the first tier of trench capacitors 121.

According to particular implementations, the second tier of trench capacitors 122 can be interconnected with the first tier of trench capacitors 121. To form interconnections between respective layers in the first and second capacitor tiers, vias extending through insulating layer 114 can be formed by anisotropic etching and then backfilled with a suitable conducting or dielectric material. Referring still to FIG. 7, primary vias 131 and secondary vias 132 can be each filled with a conductive material to form respective electrical connections between the primary electrodes in the first and second tiers and between the secondary electrodes in the first and second tiers. Tertiary vias 133 can be filled with a dielectric material to connect the dielectric layer of the first trench capacitor with the dielectric layer of the second trench capacitor. The conducting material used to electrically interconnect the respective primary and secondary electrodes can be compositionally equivalent or compositionally non-equivalent to the conducting material forming the electrodes themselves.

Figure 8:
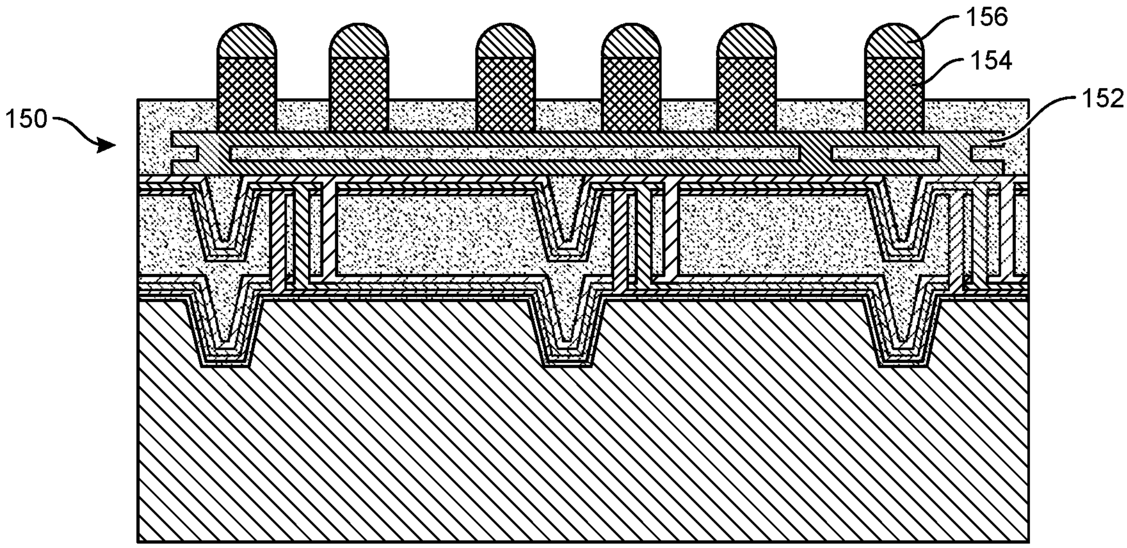
FIG. 8 is a schematic illustration of an example process flow for forming an integrated passive device having increased capacitance density including the formation of an interconnect structure over the multilayer trench capacitor stack of FIG. 7 according to some implementations.

Turning to FIG. 8, a backend metallization architecture can be formed over the structure 100 of FIG. 7. Metallization architecture 150 can include a redistribution layer (RDL) 152 connected through under bump metallization (UBM) 154 to solder bumps 156. Further interconnect structures include micro-bumps and metal pads. The redistribution layer 152 can be configured to reroute electrical connections to desired locations. For instance, a solder bump or bump array located in the center of a chip can be redistributed to positions proximate to the chip edge. Redistribution can enable higher contact density and facilitate subsequent packaging steps. Through the redistribution layer 152, capacitor electrodes within the plural tiers can be routed to the solder ball contacts and connected to power or ground.

Figure 9:
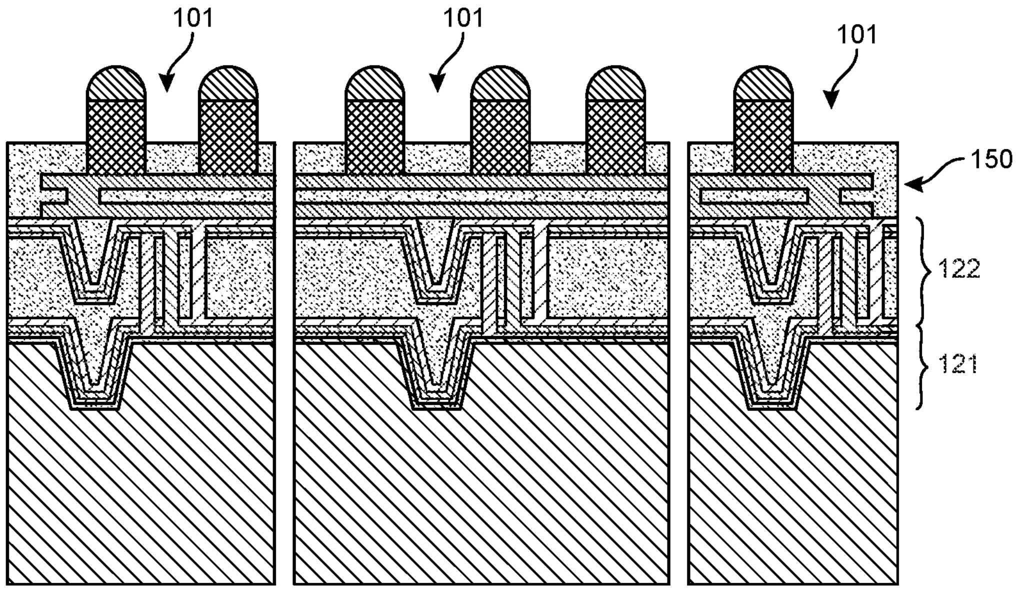
FIG. 9 is a schematic illustration of an example process flow for forming an integrated passive device having increased capacitance density including the singulation of the multilayer trench capacitor stacks of FIG. 8 according to some implementations.

As will be appreciated, the electrical coupling of the stacked trench capacitors in FIG. 8 is merely exemplary. In different implementations, the trench capacitors can be electrically coupled to the solder bumps 156 and/or active devices (e.g., transistors) within the substrate 102. As shown in FIG. 9, the post-metallized structure can be diced into individual die 101 using a suitable cutting tool, such as a diamond saw.

Figure 10:
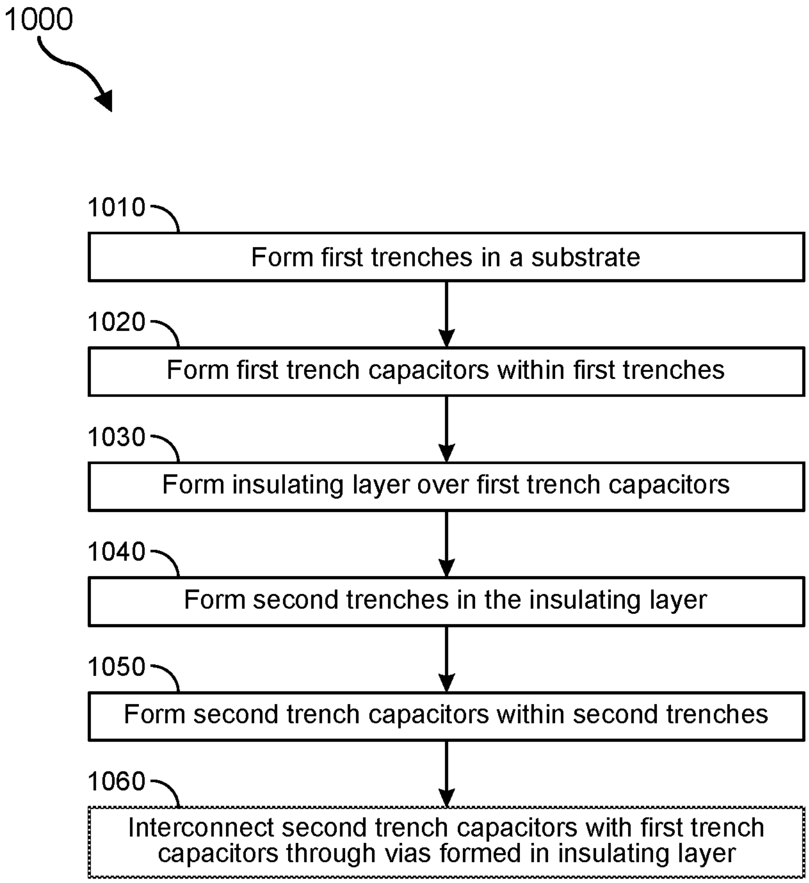
FIG. 10 is a flowchart outlining an exemplary method for forming an increased density integrated passive device according to some implementations.

FIG. 10 is a flowchart outlining a method for increasing capacitance density in an integrated passive device. An example method (1000) includes forming first trenches within a substrate (1010), forming first trench capacitors within the first trenches (1020), forming an insulating layer over the substrate and over the first trench capacitors (1030), forming second trenches within the insulating layer (1040), forming second trench capacitors within the second trenches (1050), and interconnecting the second trench capacitors with the first trench capacitors through vias formed in the insulating layer (1060).

While the foregoing disclosure sets forth various implementations using specific block diagrams, flowcharts, and examples, each block diagram component, flowchart step, operation, and/or component described and/or illustrated herein can be implemented, individually and/or collectively, using a wide range of hardware, software, or firmware (or any combination thereof) configurations. In addition, any disclosure of components contained within other components should be considered example in nature since many other architectures can be implemented to achieve the same functionality.

The process parameters and sequence of steps described and/or illustrated herein are given by way of example only and can be varied as desired. For example, while the steps illustrated and/or described herein can be shown or discussed in a particular order, these steps do not necessarily need to be performed in the order illustrated or discussed. The various example methods described and/or illustrated herein can also omit one or more of the steps described or illustrated herein or include additional steps in addition to those disclosed.

The preceding description has been provided to enable others skilled in the art to best utilize various aspects of the example implementations disclosed herein. This example description is not intended to be exhaustive or to be limited to any precise form disclosed. Many modifications and variations are possible without departing from the spirit and scope of the present disclosure. The implementations disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

The term "approximately" in reference to a particular numeric value or range of values can, in certain implementations, mean and include the stated value as well as all values within 10% of the stated value. Thus, by way of example, reference to the numeric value "50" as "approximately 50" can, in certain implementations, include values equal to 50±5, i.e., values within the range 45 to 55.

The term "substantially" in reference to a given parameter, property, or condition can mean and include to a degree that one of ordinary skill in the art would understand that the given parameter, property, or condition is met with a small degree of variance, such as within acceptable manufacturing tolerances. By way of example, depending on the particular parameter, property, or condition that is substantially met, the parameter, property, or condition can be at least approximately 90% met, at least approximately 95% met, or even at least approximately 99% met.

It will be understood that when an element such as a layer or a region is referred to as being formed on, deposited on, or disposed "on" or "over" another element, it can be located directly on at least a portion of the other element, or one or more intervening elements can also be present. In contrast, when an element is referred to as being "directly on" or "directly over" another element, it can be located on at least a portion of the other element, with no intervening elements present.

While various features, elements or steps of particular implementations may be disclosed using the transitional phrase "comprising," it is to be understood that alternative implementations, including those that may be described using the transitional phrases "consisting of" or "consisting essentially of," are implied. Thus, for example, implied alternative implementations to a dielectric layer that comprises or includes silicon dioxide include implementations where a dielectric layer consists essentially of silicon dioxide and implementations where a dielectric layer consists of silicon dioxide.

What is claimed is:

1. An integrated passive device capacitor comprising:

a first trench capacitor disposed within a first trench of a substrate; and comprising a first dielectric layer between a primary electrode of the first trench capacitor and a secondary electrode of the first trench capacitor;

a second trench capacitor disposed over the substrate within a second trench of an insulating layer on the substrate and comprising a second dielectric layer between a primary electrode of the second trench capacitor and a secondary electrode of the second trench capacitor; and a via comprising a dielectric material and extending through the insulating layer from the first dielectric layer to the second dielectric layer to connect the first dielectric layer with the second dielectric layer.

2. The integrated passive device capacitor of claim 1, wherein the substrate comprises glass or a semiconductor.

3. The integrated passive device capacitor of claim 1, wherein the first trench capacitor and the second trench capacitor are interconnected in a manner effective to increase a capacitance density of the integrated passive device capacitor relative to a capacitance density of the first trench capacitor and the second trench capacitor.

4. The integrated passive device capacitor of claim 1, wherein respective primary electrodes, secondary electrodes, and dielectric layers of the first and second trench capacitors are connected through material filled vias that extend through the insulating layer.

5. The integrated passive device capacitor of claim 1, comprising a multilayer stack of N co-integrated trench capacitors, wherein N>2.

6. A method comprising:

forming a first trench capacitor within a substrate, the first trench capacitor comprising a first dielectric layer;

forming a second trench capacitor within an insulating layer overlying the substrate, the second trench capacitor comprising a second dielectric layer; and connecting the first and second trench capacitors through connection vias that extend through the insulating layer to form an integrated passive device (IPD) capacitor, wherein the connection vias includes a via comprising a dielectric material that extends from the first dielectric layer to the second dielectric layer to connect the first dielectric layer to the second dielectric layer.

7. The method of claim 6, wherein a capacitance density of the integrated passive device (IPD) capacitor is approximately equal to a sum of a capacitance density of the first and second trench capacitors.

8. The method of claim 6, wherein the substrate comprises glass or a semiconductor.

9. The method of claim 6, wherein forming the first trench capacitor comprises successively forming a primary electrode layer, a dielectric layer, and a secondary electrode layer within a trench formed in the substrate.

10. The method of claim 6, comprising forming the insulating layer directly over portions of the first trench capacitor.

11. The method of claim 6, wherein forming the second trench capacitor comprises successively forming a primary electrode layer, a dielectric layer, and a secondary electrode layer within a trench formed in the insulating layer.

12. The method of claim 6, wherein the first and second trench capacitors are connected in parallel.

13. The method of claim 6, wherein connecting the first and second trench capacitors comprises:

electrically connecting a primary electrode layer within the first trench capacitor with a primary electrode layer within the second trench capacitor;

connecting a dielectric layer within the first trench capacitor with a dielectric layer within the second trench capacitor, and electrically connecting a secondary electrode layer within the first trench capacitor with a secondary electrode layer within the second trench capacitor.

14. The method of claim 6, further comprising forming a redistribution structure over the second trench capacitor and forming an interconnect structure over the redistribution structure.

15. The method of claim 6, further comprising:

forming a third trench capacitor within a second insulating layer overlying the insulating layer; and connecting the second and third trench capacitors through connection vias that extend through the second insulating layer.

16. A method comprising:

forming a first trench within a substrate;

forming a first trench capacitor within the first trench, the first trench capacitor comprising a primary electrode, a dielectric layer overlying the primary electrode, and a secondary electrode overlying the dielectric layer;

forming an insulating layer over the first trench capacitor and over the substrate;

forming a second trench within the insulating layer;

forming a second trench capacitor within the second trench, the second trench capacitor comprising a primary electrode, a dielectric layer overlying the primary electrode, and a secondary electrode overlying the dielectric layer;

forming vias that extend entirely through the insulating layer;

forming a conductive layer within primary vias to electrically connect the primary electrode of the first trench capacitor with the primary electrode of the second trench capacitor;

forming a conductive layer within secondary vias to electrically connect the secondary electrode of the first trench capacitor with the secondary electrode of the second trench capacitor; and forming a dielectric layer within tertiary vias to connect the dielectric layer of the first trench capacitor with the dielectric layer of the second trench capacitor to form an integrated passive device capacitor.

17. The method of claim 16, wherein the insulating layer is formed directly over at least a portion of the first trench capacitor.

18. The method of claim 16, wherein the vias are formed using an anisotropic etch.

19. The method of claim 16, wherein:

the primary electrode of the first trench capacitor, the primary electrode of the second trench capacitor, and the conductive layer within the primary vias are compositionally equivalent; and the secondary electrode of the first trench capacitor, the secondary electrode of the second trench capacitor, and the conductive layer within the secondary vias are compositionally equivalent.

20. The method of claim 16, wherein a capacitance density of the integrated passive device capacitor is greater than a capacitance density of the first trench capacitor and greater than a capacitance density of the second trench capacitor.

* * * * *